United States Patent [19]

Mizutani et al.

[11] Patent Number: 4,723,845
[45] Date of Patent: Feb. 9, 1988

[54] OPTICAL APPARATUS FOR THE DETECTION OF POSITION

[75] Inventors: Hideo Mizutani, Yokohama; Yutaka Suenaga, Kawasaki, both of Japan

[73] Assignee: Nippon Kogaku K. K., Tokyo, Japan

[21] Appl. No.: 911,464

[22] Filed: Sep. 25, 1986

[30] Foreign Application Priority Data

Sep. 30, 1985 [JP] Japan .............................. 60-217311

[51] Int. Cl.$^4$ .............................................. G01B 11/27
[52] U.S. Cl. .................................... 356/375; 356/152; 356/400; 250/561
[58] Field of Search .................. 356/1, 152, 375, 399, 356/400; 250/561

[56] References Cited

U.S. PATENT DOCUMENTS 4,558,949 12/1985 Uehara et al. ................. 356/375 X Primary Examiner—Gene Wan
Assistant Examiner—Robert J. Pascal
Attorney, Agent, or Firm—Shapiro and Shapiro

[57] ABSTRACT

An optical apparatus for detecting the position of an object by projecting a light image onto the object through a transparent plate and detecting the reflected light from the object through the transparent plate is disclosed. The projection optical system includes a first objective lens for forming the light image. The optical axis of the projection is disposed inclined to the abovesaid transparent plate. The detection optical system includes a second objective lens for refocusing the light reflected from the object. The optical axis of the reflection light detection between the second object lens and the object is disposed inclined to the transparent plate. The apparatus further comprises plane parallel optical members mounted obliquely so as to cancel the asymmetric aberrations generated by the above-said transparent plate. One of the aberration-correcting plane parallel optical members is interposed in the projection optical path on the side opposite to the transparent plate relative to the first objective lens. The other one is interposed in the detection optical path on the side opposite to the transparent plate relative to the second objective lens.

7 Claims, 11 Drawing Figures

FIG.4
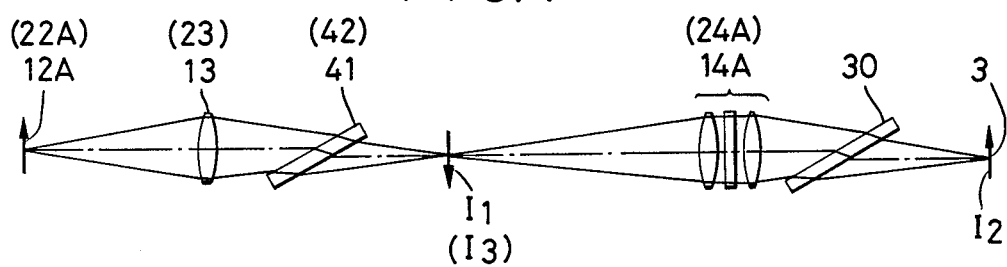
FIG.5A  FIG.5B  FIG.5C
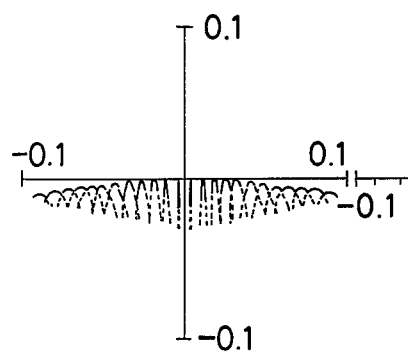 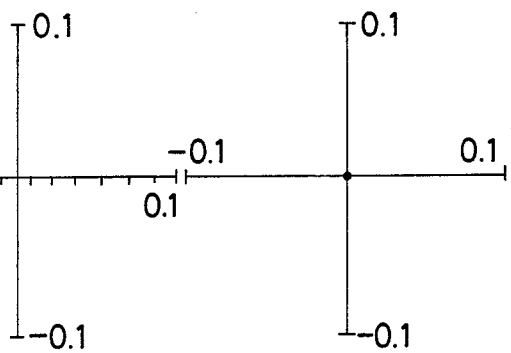
FIG.6
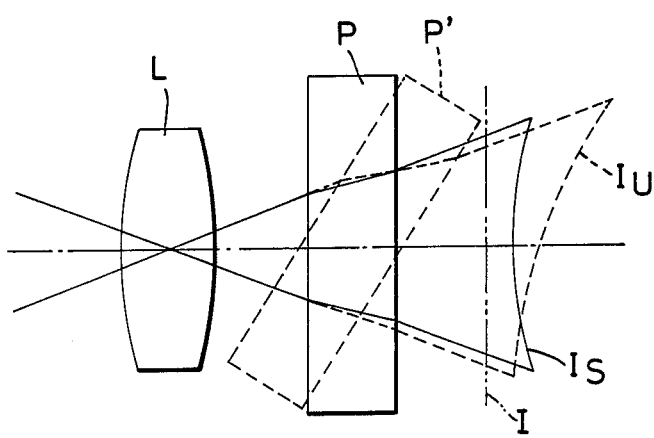

OPTICAL APPARATUS FOR THE DETECTION OF POSITION

BACKGROUND OF THE INVENTION

1. Field of the Invention:

The present invention relates to a position detection optical apparatus in which a light spot is obliquely projected onto an object surface to be examined and the reflected light from the object surface is detected to measure the position of the object surface. More particularly, the present invention relates to such optical apparatus for the detection of position in which the detection is carried out obliquely through a transparent plate covering the object surface to be examined.

2. Related Background Art

Projection optical systems for projecting a particularly shaped light spot onto an object surface and detection optical systems for detecting the reflected light from the object surface are all known in the art.

In this kind of the optical system it is most desirable to use such optical elements having an isotropic form relative to the optical axis of the optical system, that is, optical elements having a rotation-symmetrical configuration relative to the optical axis. By doing so, generally the most optimum construction can be obtained in view of the imageforming performance of the optical system. When the optical system contains one or more plane parallel transparent members such as window glass and prism block, the plane parallel member is usually disposed with its light incidence and exit surfaces being normal to the optical axis. In other words, it is a common practice in the art to arrange such plane parallel member in the position in which the normals to the respective planes of the member extend in parallel to the optical axis of the optical axis.

However, there may be such cases where the plane parallel member can not be disposed normally to the optical axis but it must be disposed inclined to the optical axis owing to some limitations or special conditions and man has to carry out the detection of position through the inclined plane parallel member.

For example, the following cases can be mentioned for it:

Man views obliquely an object surface through a window glass mounted extending in parallel to the object surface;

Man views an object contained in a sealed container obliquely and through a window glass; and Man carries out the detection of focus to such an object contained in a container obliquely and through a window glass.

In these cases, the plane parallel member such as glass plate existing in the optical path is inclined. Therefore, if the light running along the optical path in which the plane parallel member is existing is not a collimated light beam, then there may be produced aberrations even at the object point on axis. The aberrations are asymmetrical to the optical axis. In this case, therefore, it is impossible to form a sharp and clear image of the object. The generation of such aberrations is more remarkable with increasing the inclination and thickness of the plane parallel member.

The reduction of optical performance of the optical system as mentioned above may be obviated by disposing the plane parallel member in a collimated light beam. However, to form the optical path of a collimated light beam, a long optical system is required, which is against the realization of the apparatus having a small and compact construction.

The above-mentioned problem is present also in the manufacture of semiconductor devices employing the so-called projection exposure apparatus.

As well known, in the manufacture of semiconductor devices with the projection exposure apparatus, there is the case where a wafer is contained in an air-tightly closed container filled with a particular gas. In this case, exposure to the wafer is carried out vertically from above through a glass window of the gas container. Under the condition, the focusing and alignment for the wafer must be carried out obliquely through the same window glass.

Many other limitations and conditions are known for this kind of the optical system under which we are obliged to dispose a plane parallel member (window glass) in a convergent beam or in a divergent beam (hereinafter referred to as non-collimated beam inclusively) or we can not form the desired collimated beam system. In these cases also the image-forming performance of the optical system is inevitably dropped down by the generation of asymmetric aberrations and we can not improve the accuracy of detection.

SUMMARY OF THE INVENTION

Accordingly, it is a general object of the present invention to overcome the drawbacks of the prior art apparatus as mentioned above.

More specifically, it is an object of the invention to provide a position-detecting optical apparatus in which those asymmetric aberrations are corrected which are generated when an image of an object is formed through a plane parallel member obliquely disposed to the optical axis.

It is another object of the invention to provide a position-detecting optical apparatus which enables to detect the position of an object surface with very highly improved accuracy.

To attain the above objects, the present invention provides an optical apparatus for detecting the position of an object by projecting a light image having a determined shape onto the object through a transparent plate and detecting, through the transparent plate, the reflected light from the object on which the light image has been projected. The apparatus comprises a projection optical system and a detection optical system. The projection optical system includes a first objective lens for forming the light image having a determined shape on the object. The optical axis of the projection optical system through which the light image formed by the objective lens is projected onto the object surface is disposed inclined to the above-said transparent plate. The detection optical system includes a second objective lens for refocusing the light reflected from the object. The optical axis of the reflection light detecting optical system between the second object lens and the object is disposed inclined to the transparent plate. The apparatus further comprises plane parallel optical members mounted obliquely so as to cancel the asymmetric aberrations generated by the above-said transparent plate. To this end, one of the aberration-correcting plane parallel optical members is interposed in the projection optical path on the side opposite to the transparent plate relative to the first objective lens. The other one is interposed in the detection optical path on the side opposite to the transparent plate relative to the second objective lens.

In a preferred embodiment of the invention, the transparent plate and the plane parallel optical member have the same optical path length. In other words, they have substantially the same product of refractive index and thickness. Further, the part of the non-collimated beam passing through the transparent plate and the part of the non-collimated beam in which the plane parallel optical member is interposed, have nearly the same numerical aperture. In this embodiment, the aberrations generated by the transparent plate can be corrected very well by the plane parallel optical members.

The term "the part of the non-collimated beam in which the plane parallel optical member is interposed" as used in the above description means the divergent beam incident to the object lens in the projection optical system, the convergent beam exiting from the objective lens in the detection optical system or a divergent or convergent beam incident to or exiting from a relay lens or the like optionally arranged next to the objective lens.

The part of beam passing through the transparent plate and the part of beam in which the plane parallel optical member is interposed should have substantially the same maximum angle of divergence (corresponding to the numerical aperture NA).

The non-collimated beam part in which the plane parallel optical member is interposed may be on the optical axis of the objective lens or on the optical axis of a relay lens. More concretely, when the transparent plate and the plane parallel optical member are arranged with the objective lens therebetween, it is preferable to arrange the two members in parallel to each other. In the case where the optical system additionally comprises a relay lens and the plane parallel optical member is disposed in the convergent beam from the relay lens of the projection optical system or in the divergent beam from the relay lens of the detection optical system, it is preferable to set the plane parallel optical member in such manner that it is inclined in the opposite direction to the transparent plate relative to the optical axis. In other words, the transparent plate and the plane parallel optical member are preferably arranged symmetrically each other relative to the plane normal to the optical axis.

According to the present invention having the features as described above, when an image of light on an object is to be detected through a transparent plate inclined to the optical axis, the asymmetric aberration of the light image can be corrected very well.

Therefore, in the apparatus according to the invention, the image-forming performance is maintained always good however large the thickness and/or the inclination of the slant transparent plate may be. This enables to increase up the freedom for optical design and to improve the accuracy for the detection of the object position.

Other and further objects, features and advantages of the present invention appear more fully from the following description taken in connection with the accompanying drawings.

BRIEF DESCRIPTION OF THE DRAWINGS

FIG. 4 shows a third embodiment of the invention in which the plane parallel plate as shown in FIG. 2 is provided in the light beam of a relay system;

FIGS. 5A, 5B and 5C are spot diagrams showing the aberration correction effect attained by the present invention of which FIG. 5A is a spot diagram showing the aberration generated by the transparent window glass, FIG. 5B is a spot diagram in the case where aberration-correcting plates are provided and FIG. 5C is a spot diagram in the case where a cylindrical lens is interposed between two positive lenses constituting the image-forming optical system shown in FIGS. 2 and 4;

FIG. 6 is a view illustrating the field curvature;

DESCRIPTION OF THE PREFERRED EMBODIMENTS

Figure 1:
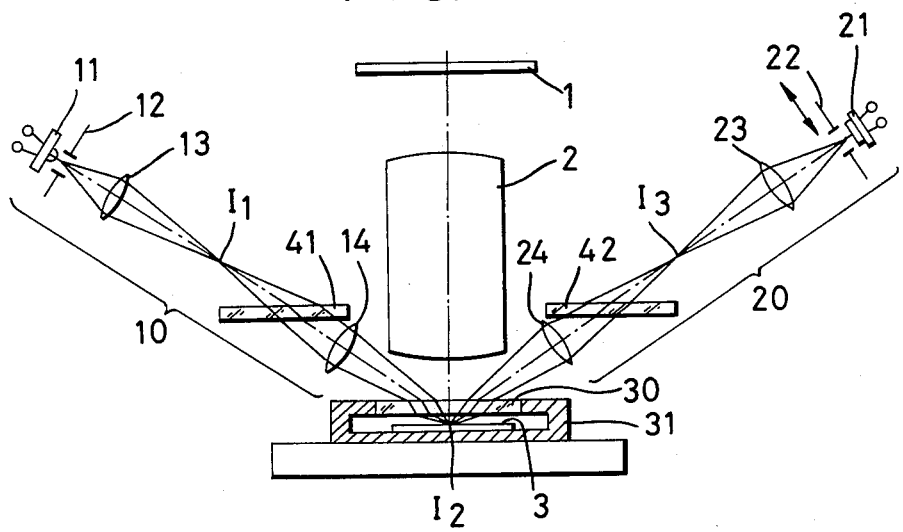
FIG. 1 schematically shows the arrangement of an embodiment of the position-detecting optical apparatus according to the invention incorporated into a projection type exposure apparatus.

FIG. 1 shows an embodiment of the present invention as a position-detection optical apparatus adapted for the detection of focus position of a projection type exposure apparatus for the manufacture of semiconductor devices.

Designated by 1 is a reticle having a pattern formed thereon. An image of the pattern is projected on a wafer 3 through a projection objective lens 2. The wafer has a coating of sensitizer which is exposed to the projected pattern.

The wafer 3 is in a closed container composed of a box-like main body 31 and a transparent window 30. The container is filled with a special gas. Therefore, the exposure on the wafer 3 is carried out in the special gas by projecting the pattern image on the wafer by the projection lens 2 through the transparent window glass 30.

In the above-mentioned type of exposure apparatus there is generally provided a position detection apparatus for aligning the wafer 3 with the projection objective lens 2, especially for positioning the wafer 3 correctly at the focus position of the lens 2.

The function of the position-detecting optical apparatus is to attain a precise alignment of the wafer 3 with the focus position of the projection objective lens 2. The function for alignment must be performed so as not to interfere with the exposure on the wafer through the projection lens 2. To this end, a beam of light for alignment is projected onto the wafer through the window 30 in a direction largely inclined relative to the optical axis of the projection lens 2. The alignment beam is focused into a light spot having a determined shape on the wafer through the position-detection optical apparatus. The surface of the wafer 3 reflects the projected light. The detection optical apparatus detects the reflected light from the wafer to measure the position of the wafer exactly.

In the first embodiment shown in FIG. 1, the position-detection optical apparatus is formed as a slit image type of position detection unit. It comprises a slit image projection system 10 and a slit image detection system 20.

In the slit image projection system 10, a light source 11 which may be, for example, a light-emitting diode emits illumination light to illuminate a slit plate 12. The light beam passed through the slit plate 12 is once focused through a relay lens 13 and then the beam is focused on the wafer surface by a first objective lens 14 through the transparent window glass 30.

The focused beam on the wafer forms a light spot as an image of the slit. Since the slit in the slit plate 12 is so formed that the longitudinal direction of the slit corresponds to the direction normal to the incidence plane of the incident light to the wafer 3 (the incidence plane is a plane parallel with the plane of the drawing), the light spot of the slit image formed on the wafer 3 is a spot elongated in the direction normal to the plane of the drawing.

The slit image once focused by the relay lens 13 is refocused on the wafer as the elongated light spot by the objective lens 14 with one-to-one magnification. On the side of the relay lens 13, a first plane parallel plate 41 is interposed in the divergent beam toward the objective lens 14. The function of the first plane parallel plate 41 is to correct the asymmetirical aberration of which a detailed description will be made later.

The first plane parallel plate 41 has the same thickness and the same refractive index as the transparent window glass 30 does. Furthermore, the plane parallel plate 41 is disposed parallel to the window glass 30. For the reasons as will be described later, those asymmetric aberrations can be compensated well by it which may be produced by the transparent window glass 30 inclined to the optical axis of the first objective lens 14.

In the manner described above, a beam of light is projected on the wafer 3 (an object to be measured) and the wafer reflects the light. The reflected light enters the light spot (slit image) detection system 20.

In the detection system 20, the reflected light is once focused through a second objective lens 23 and then it is refocused on a detection slit 22 through a relay lens 23. Thus, an image of the slit 12 is again formed on the detection slit 22. The second objective lens 24 refocuses the light spot of the slit image on the wafer with one-to-one magnification.

The detection slit is mounted for oscillation in the direction normal to longitudinal direction of the slit image in a plane normal to the optical axis. Disposed behind the detection slit is a photo sensor 21 the output of which is modulated in accordance with the oscillation of the detection slit 22. The positional relation between lens 2 and wafer 3 can be determined by synchronous detection of the output from the sensor 21 with the oscillation frequency of the detection slit 22.

As the transparent window glass 30 is inclinded to the optical axis of the second objective lens 24, a second plane parallel plate 42 is provided in this detection system 20 to compensate the asymmetric aberration. The plane parallel plate 42 is interposed in the convergent light beam from the objective lens 21. Again, the plane parallel plate 42 has the same thickness and the same refractive index as the window glass 30, and the plate 42 is disposed parallel to the window glass 30.

Since the objective lens 24 is a one-to-one magnification image-forming optical system, the divergent beam passing through the window glass 30 and the convergent beam passing through the plane parallel plate 42 have the same angle of divergence. Consequently, the asymmetric aberrations generated by the window glass 30 are cancelled by the second plane parallel plate 42. Thus, also in the detection system, the asymmetric aberrations are compensated well and the focus detection can be achieved at very high degree of accuracy.

In this embodiment, a slit image is projected on an object. Therefore, the ability essential for the optical system of the position-detecting optical apparatus is the image-forming ability only in widthwise direction of the slit. So long as the slit is disposed on the optical axis of the optical system, the off-axial image-forming ability may be left out of consideration.

As will be described later, astigmatic difference is produced by the insertion of the plane parallel plate. But, in this embodiment employing the slit image projection system, the astigmatic difference constitutes no problem.

It is unnecessary for this position-detecting optical apparatus to include a cylindrical lens for correcting the astigmatic difference. However, when the position detection is carried out according the point image projection method, it is needed to compensate the astigmatic difference by use of a cylindrical lens as shown later.

Further, if it is wished to observe a broader area of the wafer surface obliquely without any interference with the optical path of the projection objective lens 2, not only the astigmatic aberration but also asymmetric field curvature must be compensated by use of a cylindrical lens.

Figure 2:
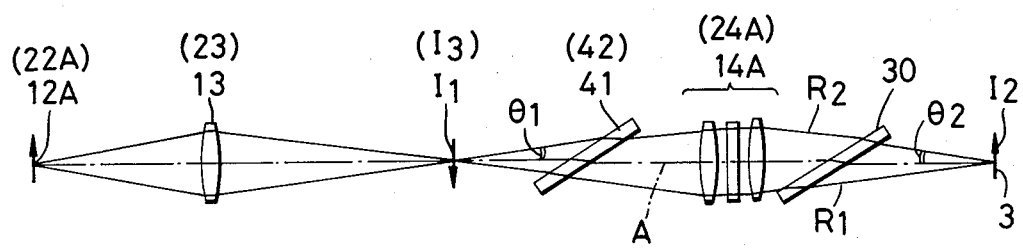
FIG. 2 shows a second embodiment of the position-detecting optical apparatus in which an spot image is detected in stead of a slit image in the first embodiment.

FIG. 2 shows a second embodiment of the invention. In this second embodiment, a pin hole is used instead of the slit plate 12 used in the first embodiment, and a point image is projected on an object to be measured.

Like the first embodiment, this second embodiment is composed of a projection system and a detection system. Since the two systems are arranged substantially symmetrically to each other and have functionally the same elements, only the projection system is shown in FIG. 2. As for the detection system, only the reference numerals of the elements are given in the figure.

In the second embodiment, a pinhole 12A is illuminated by an illumination light source such as a light-emitting diode not shown. A light image $I_1$ of the pinhole is once focused by a relay lens 13 of the projection system. A first objective lens 14A refocuses a secondary light image $I_2$ on the object (wafer) 3 as a light spot. The object 3 is contained in a closed container having a transparent window glass 30 as shown in FIG. 1. The window glass 30 is in the convergent beam between the lens 14A and the secondary light image $I_2$ and inclined to the optical axis. The transparent window glass 30 produces asymmetric aberrations. In order to compensate the aberrations, a first plane parallel plate 41 is interposed in the divergent beam incident to the first objective lens 14A composed of two positive lens components a and c and a cylindrical lens b between the two positive lens components. As to the cylindrical lens b, a further description will be made later.

The magnification of the first objective lens 14A is one-to-one (by $-1$). The divergent beam in which the first plane parallel plate 41 is interposed and the convergent beam in which the window glass 30 is interposed have the same angle of divergence. The first plane parallel plate 41 and the window glass 30 have the same thickness and the same refractive index. Further, they have the same inclination angle to the optical axis A and they are parallel to each other.

The light image (light spot) $I_2$ is reflected on the object 3. The reflected light travels along the optical axis of the detection system in the same manner as in the first embodiment previously shown in FIG. 1. After passing through the transparent window glass 30 inclined to the optical axis, the reflected light enters a second objective lens 24 containing a cylindrical lens b as shown in FIG. 2. A light image $I_3$ conjugated with the above light image $I_2$ is formed by the objective lens 24A through a second plane parallel plate 42 provided to compensate aberration. Further, through a relay lens 23, the light image is refocused on a photo sensor such as a divided sensor not shown. The position of the object 3 is detected from the position at which the light image is formed on the sensor. In the detection system also, the second objective lens has a magnification of one-to-one. Therefore, the convergent beam in which the second plane parallel plate is interposed and the divergent beam in which the window glass 30 is interposed have the same angle of divergence. Further, the plate 42 and the glass 30 have the same thickness and refractive index. They are parallel to each other and have the same inclination relative to the optical axis A.

The optical actions of the transparent window glass and the plane parallel plate in the embodiment shown in FIG. 2 will be described hereinafter with reference to FIGS. 3A and 3B.

Figure 3A:
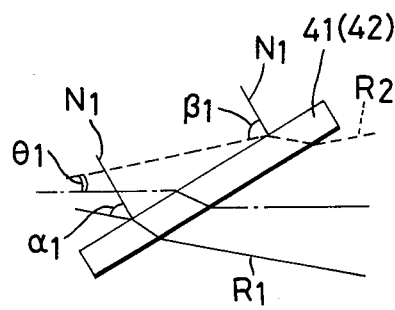
FIGS. 3A and 3B are views illustrating the optical actions of the transparent window glass and the aberration-correcting plane parallel plate, FIG. 3A showing the plane parallel plate in the divergent beam and FIG. 3B the transparent window glass in the convergent beam.
Figure 3B:
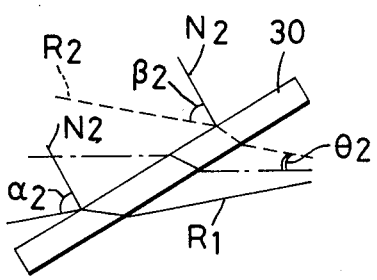

FIG. 3A illustrates the state of the light beam passing through the aberration-compensating plane parallel plate 41(42) and FIG. 3B illustrates that of the light beam passing through the transparent window glass 30.

As shown in FIG. 3B, the marginal ray $R_1$ passing through the lower portion of the window glass 30 (solid line) has an angle $\alpha_2$ to the normal $N_2$ of the glass 30. On the other hand, the marginal ray $R_2$ passing through the upper portion of the window glass 30 (broken line) has an angle $\beta_2$ ($<\alpha_2$) to the normal $N_2$ of the glass. As a result, as far as the transparent window glass 30 concerns, the lower marginal ray $R_1$ has a longer optical path length than the upper marginal ray $R_2$. In the transparent window glass 30, therefore, the optical path lengths of the rays are rendered asymmetrical. Thereby asymmetric aberration is generated.

On the contrary, as shown in FIG. 3A, the marginal ray $R_1$ passing through the lower portion of the aberration-compensating plane parallel plate 41(42) has an angle $\alpha_1$ to the normal $N_1$ of the plate 41(42). The marginal ray $R_2$ passing through the upper portion of the plane parallel plate 41(42) has an angle $\beta_1(>\alpha_1)$ to the normal $N_1$ of the plate 41(42).

Since, as previously noted, the objective lens 14A(24A) is an image-forming system of one-to-one magnification, the beams on the both sides of the lens have the same angle of divergence:

$$\theta_1 = \theta_2$$

Further, the transparent window glass 30 and the plane parallel plate 41(42) are parallel to each other. Consequently, $$\alpha_1 = \beta_2, \beta_1 = \alpha_2$$

Generally, the optical path length of a light ray passing through a plane parallel plate is determined by insidence angle, thickness and refractive index of the plane parallel plate.

For the purpose of explanation, let the optical path length of the above-mentioned lower marginal ray $R_1$ passing through the plane parallel plate 41(42) be $l_{11}$ and that of the upper marginal ray $R_2$ be $l_{12}$ ($>l_{11}$). Similarly, let the lower marginal ray $R_1$ passing through the window glass 30 be $l_{21}$ and that of the upper marginal ray $R_2$ be $l_{22}(<l_{21})$. Then, since the window glass 30 and the plane parallel plate 41(42) have the same thickness and refractive index, $$l_{11}=l_{22}, l_{12}=l_{21}$$

Consequently, $$l_{11}+l_{21}=l_{12}l_{22}$$

Therefore, regarding the rays $R_1$ and $R_2$ passing through the lower portion and the upper portion of the objective lens 14A(24A) among marginal rays from the object point on axis as shown in FIG. 2, their composite optical path lengths are equal to each other. The composite optical length of the ray $R_1$ composed of the transparent window glass 30 and the plane parallel plate 41(42) is equal to the composite optical path length of the ray $R_2$ composed of the glass plate 30 and the plane parallel plate 41(42). The two composite optical path lengths are symmetrical relative the optical axis. In conclusion, the asymmetric aberration generated by the transparent window glass 30 is well compensated by the insertion of the plane parallel plate 41(42).

As will be understood from the embodiments shown in FIGS. 1 and 2, according to the present invention, the asymmetric aberration produced by the transparent window glass 30 which is a plane parallel plate, disposed inclined to the optical axis is well corrected in a simple manner by inserting such a plane parallel plate (41, 42) obliquely in the optical path which has the same thickness and the same refractive index, that is, the same optical path length as the window glass 30. In other words, according to the invention, the asymmetric aberration can be corrected by cancelling the asymmetricity of the optical path length at the window 30 with the inverted asymmetricity of the optical path length at the plane parallel plate 41(42).

The feature of the present invention, that is, the correction of asymmetric aberration by use of a plane parallel plate may be embodied variously. Other embodiments than the above embodiments 1 and 2 are of course possible.

FIG. 4 shows a third embodiment of the invention.

Referring to FIG. 4 similar to FIG. 2, again asymmetric aberrations are produced by the window glass 30 which is a plane parallel plate. To compensate the asymmetric aberrations there are provided plane parallel plates 41, 42 (only one is shown for the sake of simplicity of the drawing).

The third embodiment is distinguished from the previous embodiments in that the aberration-compensating plane parallel plate 41(42) is interposed in the light beam between the relay lens 13(23) and the light image $I_1(I_3)$. In this embodiment, therefore, the objective lens 14A(24A) is sandwiched in between the transparent window glass 30 and the plane parallel plate 41(42). The glass plate and the plane parallel plate are parallel to each other. With this arrangement, the symmetricity of the optical path lengths can be maintained to correct the asymmetric aberration.

In all of the embodiments shown in FIGS. 1, 2 and 4, the projection system and the detection system have been shown to have the same optical construction and to be symmetrically arranged relative to the object to be measured. However, it is to be understood that various modifications are possible in the arrangement of the projection system and the detection system. For exaxple, the apparatus may be composed of a projection system having the construction shown in FIG. 2 and a detection system having the construction shown in FIG. 4. Further, one or both of the relay systems may be omitted if it is necessary due to the limitation of the available space in the apparatus in which the position-detecting unit of the invention is to be incorporated.

As described above, according to the present invention, asymmetric aberrations as generated by a plane parallel member obliquely mounted such as a transparent glass plate disposed inclined to the optical axis can be corrected by providing a aberration-compensating plane parallel plate obliquely to the optical axis. However, when a plane parallel plate is obliquely interposed in a non-collimated beam (convergent beam or divergent beam), there is generated astigmatic difference to the image point on axis. The astigmatic difference is a phenomenon where the image point in the meridional plane is different from the image point in the sagittal plane. Even for the object point on the optical axis, this phenomenon of astigmatic difference is produced by the plane parallel plate disposed obliquely to the optical axis. (Herein, the meridional plane is defined as a plane containing the normal at the intersection of the optical axis and the plane parallel plate, and the optical axis). The astigmatic difference is caused by the fact that owing to the presence of the slant plane parallel plate the image point Im in the meridional plane is formed at a position farther distant from the image-forming lens than the image point Is in the sagittal plane.

Let Pm and Ps denote the distances of the image points from the image-forming lens respectively and let $i_1$ denote the angle of incidence to the plane parallel plate and $i_2$ the angle of refraction. Then, the astigmatic difference $\Delta P$ is represented by the formula:

$$P = Pm - Ps = \frac{d}{n - \cos i_2}\left(1 - \frac{\cos^2 i_1}{\cos^2 i_2}\right)$$

This astigmatic difference can be corrected by interposing a cylindrical lens in the image-forming optical system as previously shown in FIGS. 2 and 4. More concretely, the astigmatic difference can be corrected by bringing the image points in meridional plane and in sagittal plane into coincidence according to any of the following methods:

By interposing in the optical path a negative cylindrical lens which has a generating line in the meridional plane and has a diverging action in the sagittal plane; or By interposing in the optical path a positive cylindrical lens which has a generating line in the sagittal plane and has a converging action in the meridional plane.

In the objective lens 14A(24A) show in FIG. 2, the cylindrical lens b has the function to correct the astigmatic difference. The cylindrical lens b does not have any refractive power in the meridional plane (the plane of the drawing) but has a negative refractive power in the sagittal plane (the plane normal to the plane of the drawing). By its diverging action, the image point in the sagittal plane is brought into coincidence with the image point in the meridional plane to correct the astigmatic difference.

The effect for the correction of asymmetric aberration according to the present invention is demonstrated by the spot diagrams of FIGS. 5A, 5B and 5C.

To conduct experiments, an image-forming optical system was formed using two positive lenses having the same focal length of 100 mm. To obtain a collimated light beam between the two positive lenses, they were arranged symmetrically in such manner that the object point was at the front focus of one of the two positive lenses and an image of the object point was formed at the rear focus of the other one. Numerical apertures on the object side and on the image side were set to the same value of 0.1. Furthermore, on each the positive lens such a non-spherical surface was provided which could correct the spherical aberration and satisfy the sine condition.

A transparent glass plate of 8.7 mm thick and 1.5 in refractive index (the transparent window glass 30) was disposed obliquely on the object side of the image-forming optical system. The angle which the normal of the glass plate 30 formed with the optical axis was 30 degrees. FIG. 5A shows the spot diagram obtained under this condition. As clearly seen in the diagram, the spots are distributed vertical-asymmetrically relative to the optical axis.

An aberration-correcting plane parallel plate 42 was interposed in the optical path on the image side of the image-forming optical system (for example the second objective lens 24A). The aberration-correcting plane parallel plate 42 possessed the same optical characteristics as the window glass 30. FIG. 5B shows the spot diagram obtained when the plane parallel plate 42 was interposed.

Comparing the spot diagram of FIG. 5B with that of FIG. 5A, man can understood that the asymmetricity in FIG. 5A was improved by the interposition of the plane parallel plate 42.

For the reason previously described, astigmatic difference are produced even on the optical axis, not only in the construction without the aberration-correcting plane parallel plate (FIG. 5A) but also in the construction with the plane parallel plate 41(42) (FIG. 5B). In both of FIGS. 5A and 5B, m-image point (meridional image point) was ploted.

A cylindrical lens b was interposed between the two positive lens components a and c of the above image-forming optical system (for example the second objective lens 24A). FIG. 5C shows the spot diagram obtained in this construction containing the cylindrical lens. FIG. 5C demonstrates that image spots laterally distributed as in FIG. 5B can be concentrated to one point by the addition of the cylindrical lens and, therefore, the astigmatic difference can be corrected well.

In the above, the spot diagrams have been described in connection with the second objective lens 24A of the detection system in which the object point is the object to be measured 3 and the image point is $I_3$. However, it is to be understood that the same spot diagrams can be obtained even for the first objective lens 14A of the projection system in which the image point lies on the surface of the object 3.

Although the objective lens 14A(24A) shown in FIGS. 2 and 4 contains a cylindrical lens, the objective lens 14(24) shown in FIG. 1 does not contain such a cylindrical lens. Therefore, in the first embodiment shown in FIG. 1, there is generated astigmatic difference at the image point as shown in FIG. 5B.

However, in the first embodiment, the astigmatic difference does not disturb the aimed detection of position. The reason for this is that the light image formed at the image point is a light image conjugated with the slit 12 and elongated in the direction in which the astigmatic difference is generated.

In the position-detecting optical apparatus including the transparent window glass 30 and the aberration-correcting plane parallel plates 41, 42, the optical paths of the optical systems may be deflected various directions. Even in such cases, as a matter of course, the positional relationship between the window glass and the plane parallel plate is optically equivalent to that in the above embodiments considering the development of the optical axis of the optical systems.

In the above, we have discussed the image-forming performance primarily about the object point on axis of the optical system containing an aberration-correcting plane parallel plate. However, the image-forming performance must be considered also about off-axial object point in addition to the on-axial object point.

As previously described, as for the image formation of on-axial object point, the asymmetrical aberration is first compensated by the plane parallel plate 41(42) and then the astigmatic difference is corrected by the cylindrical lens b according to the present invention.

As for the off-axial object point, there is the possibility that field curvature may be produced asymmetrically according as the manner of arrangement of the transparent window glass 30 and the aberration-compensating plane parallel plate 41(42). In some arrangements, the window glass 30 and the plane parallel plate 41(42) may act as if a plane parallel plate having a thickness corresponding to the sum of their thicknesses were obliquely interposed in the image-forming optical path, which may produce curvature of image field asymmetrically.

As well-known to those skilled in the art, the field curvature as produced by a plane parallel plate interposed in a non-collimated light beam is attributable to the fact that the principal rays from the on-axial object point and from the off-axial object point have different angles of incidence to the plane parallel plate and, therefore, they have different optical path lengths as illustrated in FIG. 6.

Referring to FIG. 6, the plane parallel plate P in solid line is disposed normally to the optical axis. In this case, a curved image surface Is is formed which is convex toward the lens L. On the contrary, the plane parallel plate P' in broken line is inclined to the optical axis. In this case, the image surface Iu is asymmetrically curved.

The above phenomenon as illustrated in FIG. 6 may occur also in the constructions of the above embodiments for the following reason:

The principal ray from one off-axial end of the object surface has a relatively large angle of incidence not only to the transparent window glass 30 but also to the aberration-compensating plate 41(42). Passing through the window glass and the plane parallel plate, the principal ray has a relatively long object-image optical path length.

On the contrary, the principal ray from the other off-axial end of the object surface enters the window glass 30 and the plane parallel plate 41(42) at a relatively small incidence angle. Accordingly, the principal ray has a relatively short object-image optical path length.

Thus, the conjugate relation between object and image regarding the off-axial rays on one side of the optical axis is asymmetric to that of the off-axial rays on the other side of the optical axis.

However, even if such asymmetric field curvature is produced in the embodiments previously shown in FIGS. 1, 2 and 4, it can not have any adverse effect on the aimed detection of position. The reason for this is that in the embodiments a light image of a slit 12 or a pinhole 12A provided on the optical axis of the projection system is projected onto the object 3 and the detection system is so formed as to detect the reflected light image only on the optical axis of the detection system to detect the position of the object surface. In this construction, if the light image on the optical axis has asymmetrical field curvature, the magnitude of the field curvature is very small and within the depth of focus of the projection system and of the detection system. Therefore, it can not have any effect on the detection of position.

In the projection type exposure apparatus as shown in FIG. 1, if the object 3 is moved together with the transparent window 30 a small distance vertically along the optical axis of the projection lens 2, the light image projected on the object 3 through the projection optical system will shift a little horizontally. Accordingly, the reflected light image also shifts in the direction perpendicular to the optical axis in FIG. 1 (in the direction of double-arrow indicating the moving direction of the detection slit).

In some known apparatus, detection is made to know the shift of the reflected light image from the detection optical axis. From the detected shift of the reflected light image, man can measure the magnitude and direction of deviation of the object 3 from the reference position. In this type of detection apparatus, the detection area of light image is relatively broad. Therefore, an adequate correction of the above-mentioned asymmetrical field curvature is needed in this case.

Figure 7:
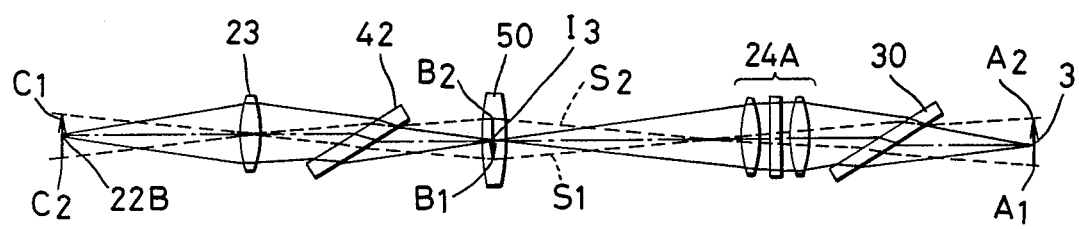
FIG. 7 is a schematic view of the projection optical system showing a fourth embodiment of the invention in which a positive lens is provided at the focus position of the relay lens shown in FIG. 4.

FIG. 7 shows a fourth embodiment of the invention containing mean for correcting the asymmetric field curvature.

Referring to FIG. 7, the detection system of the fourth embodiment basically corresponds to that of the third embodiment previously shown in FIG. 4. As the projection system of the fourth embodiment it may be of the construction shown in FIG. 2 or FIG. 4.

The detection system of the fourth embodiment contains a field lens 50 disposed on or near the primary image $I_3$ of the object to be measure. Other parts of the detection system substantially correspond to those of the detection system shown in FIG. 4 and need not be further described. Like reference numerals to FIG. 4 represent functionally the same members.

To detect the light image (of an object point on the object 3) there is provided a position detection sensor 22B which may be, for example, a linear charge coupled device (CCD). The pupil of the objective lens 24A and the pupil of the field lens 23 are approximately conjugated by the field lens 50. The field lens 50 has the function to correct the asymmetric field curvature in addition to its primary function to converge the principal rays from off-axial object points thereby preventing the decreasing of the light intensity of the edge light image.

In FIG. 7, the broken lines indicate the running paths of rays from off-axial object points (light images) $A_1$ and $A_2$ on the object 3.

The principal ray $S_1$ from the off-axial object point $A_1$ passes through the transparent window glass 30 and the object lens 24A and then reaches the image point $B_1$ of the primary image $I_3$ of the object. After being subjected to the converging action of the field lens 50, the principal ray $S_1$ is transmitted to the image point $C_1$ on the sensor 22B through the aberration-compensating plane parallel plate 42 and the relay lens 23. Thereby a secondary image is formed on the sensor 22B at the image point $C_1$.

The principal ray $S_2$ from another object point $A_2$ on the opposite side edge of the object 3 passes through the transparent window glass 30 and the object lens 24A and then reaches the image point $B_2$ of the primary image $I_3$ of the object. Being subjected to the converging action of the field lens 50, the ray $S_2$ is transmitted to the image point $C_2$ on the sensor through the plane parallel plate 42 and the relay lens 23. Thereby a secondary image of the object is formed on the sensor 24B at the image point $C_2$.

The principal ray $S_1$ from the object point $A_1$ has a larger angle of incidence to the window glass (a plane parallel plate) 30 than the principal ray $S_2$ from the object point $A_2$ does. On the contrary, when the rays enter the aberration-compensating plane parallel plate 42, the principal $S_2$ has a larger incident angle than the principal ray $S_1$ does. Consequently, as will be readily understood, regarding the optical path between the object surface 3 and the sensor surface 22B, the rays $S_1$ and $S_2$ have the same optical path length. Therefore, the optical path lengths of the off-axial object points on the object surface 3 are symmetrical each other relative to the optical axis. As a result, the image surface has a shape symmetrical relative to the optical axis, although it is curved.

Such a symmetric field curvature can easily be corrected by an image-forming optical system such as the objective lens 24A, the relay lens 23 or the like. According to the fourth embodiment, therefore, it is possible to form a sharp and clear image over a broad area of the object surface by suitably correcting the field curvature by the image-forming optical system in combination with the construction shown in FIG. 7.

In all of the embodiments shown above, the objective lens and the relay lens have been disposed eccentrically in accordance with the shift of the optical axis caused by the plane parallel plate 41(42) obliquely interposed. However, it is not always necessary for the objective lens and the relay lens to be eccentrically arranged when they satisfy the sine condition. This is because even when the image point is shifted in the direction normal to the optical axis by the transparent window glass 30 and the plane parallel plate 41(42), an image of such object point a little shifted from the optical axis can be formed without aberration so long as the image-forming lens satisfies the sine condition. But, when the optical axis is heavily shifted by the obliquely mounted plane parallel plate and probably vignetting of marginal rays may occur, it is advisable to arrange the objective lens and the relay lens eccentrically.

While the aberration-compensating plane parallel plates 41 and 42 in the above embodiments have been shown and described to have the same thickness and the same refractive index as the transparent window glass 30, it is to be understood that it is not always necessary for the plane parallel plates to be made of the same material as the material for the transparent window glass 30. The thing essential is to make the optical path lengths (optical thicknesses) substantially equal to each other. By doing so, the asymmetric aberrations can be compensated very well.

It is most desirable that the non-collimated light beam in which the window glass 30 is interposed and the non-collimated light beam in which the plane parallel plate 41(42) is interposed should have the same numerical aperture. However, it is to be noted that even when they have different numerical apertures, the aberration generated by the transparent window glass can be corrected remarkedly well as compared with the case where no aberration-compensating plane parallel plate is provided. Therefore, the image-forming lenses 14, 24, 14A, 24A in the embodiments shown in FIGS. 1 to 7 are not limited to those lenses of one-to-one magnification only. The object of the present invention may be equally attained even when the image-forming lens between the transparent window glass and the aberration-compensating plane parallel plate is a magnifying or minifying image-forming lens.

Further, it is to be understood that the transparent window obliquely disposed between the object and the objective lens may be a transparent plate made of other material than glass. For example, it may be a transparent plate made of plastics. In addition, the transparent window plate is not always necessary to be a plane parallel plate. It may be a slightly curved transparent plate.

Figure 8:
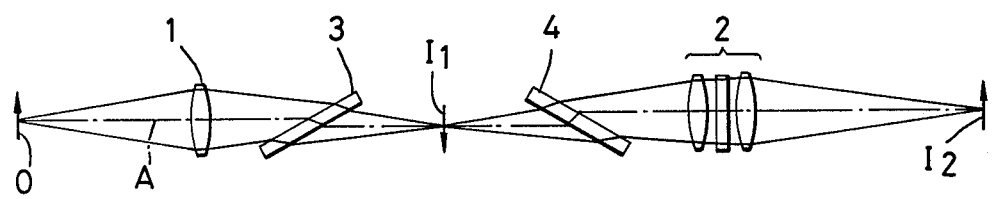
FIG. 8 is a schematic view of the arrangement of an optical system showing an example of improvement made by the present invention.

FIG. 8 shows a modified embodiment of the invention.

In this case, a plane parallel plate 3 as the window glass is obliquely interposed in the convergent light beam from an objective lens 1. To compensate the asymmetric aberration generated by the plane parallel plate (window glass) 3, this modified embodiment contains a plane parallel plate 4 interposed in the divergent light beam incident to a relay lens 2. In this modification, therefore, the first and second plane parallel plates 3 and 4 are arranged between the objective lens 1 and the relay lens 2. The object lens 1 forms a primary image $I_1$ of an object between the two plane parallel plates 3 and 4. The two plane parallel plates 3 and 4 are arranged symmetrically each other relative to the plane normal to the optical axis A of the objective lens 1 so that the symmetricity of optical path lengths relative to the optical axis may be maintained and the asymmetric aberration may be corrected satisfactorily.

What we claimed is:

1. An optical apparatus for projecting a light image having a determined shape onto an object to be measured through a transparent plate in front of the object and detecting the light reflected from the object through the transparent plate, said optical apparatus comprising:
a projection optical system having a first objective lens for forming the light image of a determined shape on the object, wherein the projection axis along which said light image formed by the first objective lens is projected onto the object is disposed inclined to the transparent plate;
a detection optical system having a second object lens for refocusing the light of the projected light image reflected from the object, wherein the reflected light detection optical axis between the second objective lens and the object is disposed inclined to the transparent plate; and plane parallel optical members provided on the respective optical axes of the first and second objective lenses on the opposite side to the transparent plate, said plane parallel optical members being disposed so inclined as to compensate the asymmetric aberrations generated by the transparent plate.

2. An optical apparatus according to claim 1, wherein the transparent plate and the plane parallel optical members have substantially the same optical path length and each of the plane parallel optical members is disposed obliquely on the optical axis of the non-collimated light beam portion which has the same numerical aperture as that of the light beam portion passing through the transparent plate.

3. An optical apparatus according to claim 1, wherein each of the first and second objective lenses is formed as a lens of one-to-one magnification and disposed between the transparent plate and the plane parallel optical member.

4. An optical apparatus according to claim 1, wherein said projection optical system further comprises a slit screen through which the first objective lens can form a light image in the form of slit and the direction of the slit is set in such manner that the longitudinal direction of the slit image formed by the first objective lens corresponds to the direction normal to the optical axis on the incidence plane of the light to the transparent plate.

5. An optical apparatus according to claim 1, wherein, when the light image to be projected by the projection optical system is a spot image, each of the first and second objective lenses contains positive lens components and a cylindrical lens component for correcting the astigmatic difference generated by the light obliquely passing through the transparent plate.

6. An optical apparatus according to claim 1, wherein the projection optical system and the detection optical system each comprises further a relay lens next to the first objective lens, a relay lens next to the second objective lens and a field lens in the vicinity of the image point between the objective lens and the relay lens, said field lens being provided to correct the asymmetricity of the field curvature generated by the light beam obliquely passing through the transparent plate and the plane parallel optical member.

7. An optical apparatus comprising:
supporting means having a transparent plate for supporting an object so that said object is disposed in the rear of said transparent plate,
a projection optical system having a first objective lens for forming the light image of a determined shape on the object, wherein the projection axis along which said light image formed by the first objective lens is projected onto the object is disposed inclined to said transparent plate;
a detection optical system having a second object lens for refocusing the light of the projected light image reflected from the object, wherein the reflected light detection optical axis between the second objective lens and the object is disposed inclined to said transparent plate; and
plane parallel optical members provided on the respective optical axis of the first and second objective lenses on the opposite side to said transparent plate, said plane parallel optical members being disposed so inclined as to compensate the asymmetric aberrations generated by said transparent plate.

* * * * *